(12) United States Patent
Hamagishi et al.

(10) Patent No.: US 7,920,609 B2
(45) Date of Patent: Apr. 5, 2011

(54) EXPOSURE DEVICE AND CIRCUIT BOARD FOR LASER CONTROLLER

(75) Inventors: Toshimitsu Hamagishi, Kyoto (JP); Mamoru Fujimoto, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 333 days.

(21) Appl. No.: 12/081,637

(22) Filed: Apr. 18, 2008

(65) Prior Publication Data

US 2008/0259978 A1    Oct. 23, 2008

(30) Foreign Application Priority Data

Apr. 20, 2007    (JP) ................................ 2007-111495

(51) Int. Cl.
*H01S 3/13* (2006.01)
*B41J 2/435* (2006.01)

(52) U.S. Cl. ................ 372/29.011; 372/38.01; 347/246

(58) Field of Classification Search ............. 372/29.011, 372/38.01; 347/246
See application file for complete search history.

(56) References Cited

U.S. PATENT DOCUMENTS 6,249,306 B1    6/2001    Isono et al.
6,385,226 B2 *  5/2002    McMinn et al. ............. 372/50.1

FOREIGN PATENT DOCUMENTS

| JP | 2000-43317   | 2/2000  |
| JP | 2003-89180   | 3/2003  |
| JP | 2005-317586  | 11/2005 |

* cited by examiner

*Primary Examiner* — Minsun Harvey
*Assistant Examiner* — Marcia A. Golub-Miller
(74) *Attorney, Agent, or Firm* — McDermott Will & Emery LLP

(57) ABSTRACT

In an exposure device comprising a laser controller that is configured as a circuit board capable of independently being changed, and that controls the emission of laser light from a laser emitter emitting laser light on receipt of an instruction for control given from a main controller responsible for overall control of the operation of the exposure device, error control information that is obtained in advance with regard to the circuit board and controls variations of a controlling factor due to a circuit error of the circuit board is stored into a memory provided to the laser controller prior to the provision of the circuit board to the exposure device. On receipt of an instruction for control given from the main controller to cause the emission of laser light in a predetermined amount of light, the laser controller determines a condition of emission of laser light based on the error control information stored in the memory to cause the laser emitter to emit laser light under the condition of emission.

3 Claims, 4 Drawing Sheets

F I G . 1
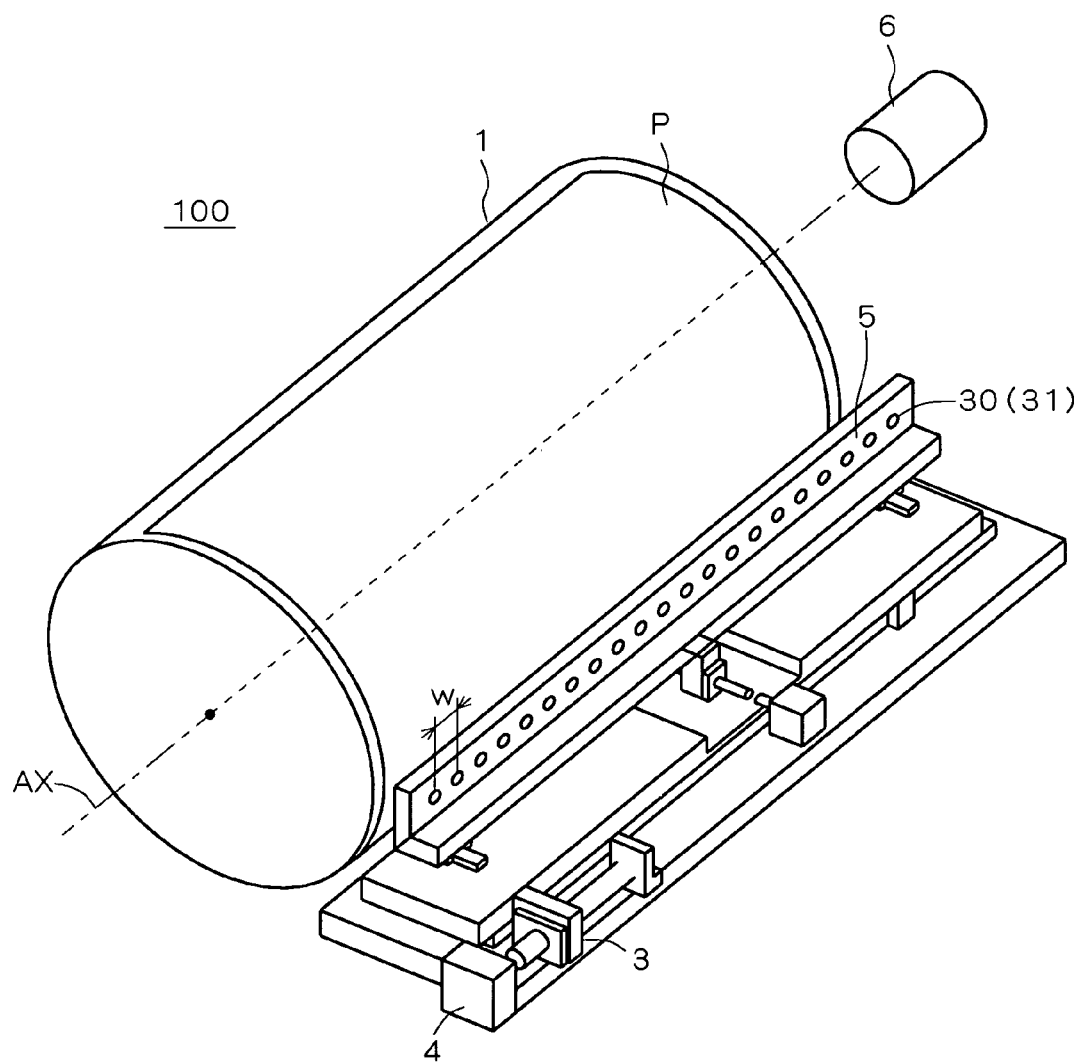

EXPOSURE DEVICE AND CIRCUIT BOARD FOR LASER CONTROLLER

BACKGROUND OF THE INVENTION

1. Field of the Invention

The present invention relates to a technique of controlling the amount of laser light used for exposure.

2. Description of the Background Art

A CTP (computer-to-plate) system for directly forming an image onto a printing plate includes a conventionally well-known CTP system that uses a laser diode (LD) in an exposure head (light source). In this CTP system, a calibration sensor is arranged in front of the LD and the amount of laser light is measured by the calibration sensor. Based on the amount thereby obtained, the value of a current to flow in the LD is controlled so that laser light can be output with a predetermined amount of light. A calibration process using this calibration sensor is normally performed each time a control board for the LD or the LD itself is changed. The calibration process is also generally performed at regular intervals in order to see the presence or absence of the degeneration of the LD.

A type of exposure for the CTP system includes a widely applied multi-beam type in which light beams are simultaneously emitted from a plurality of laser diodes to perform exposure. As an example, a publicly known CTP system comprises an exposure head with a plurality of laser diodes arranged in a linked manner in one direction, and a lens for focusing laser beams emitted from the plurality of laser diodes onto an exposure position (see for example U.S. Pat. No. 6,249,306). In another publicly known CTP system, a plurality of laser diodes are spaced apart at certain intervals, and laser beams emitted from the respective laser diodes are directly and concurrently applied to partial areas to thereby expose an entire area (see for example Japanese Patent Application Laid-Open No. 2003-89180).

An LED lighting system capable of easily being mounted or being changed to another is also publicly known (see for example Japanese Patent Application Laid-Open No. 2005-317586).

In the CTP system disclosed in U.S. Pat. No. 6,249,306, laser diodes are concentrated in one place. So a calibration sensor may be arranged in a position corresponding to the location of these laser diodes.

In contrast, in the CTP system disclosed in Japanese Patent Application Laid-Open No. 2003-89180, a plurality of laser diodes are discretely arranged. This requires a calibration sensor to be arranged in front of each laser diode at least at the time of execution of calibration. As an example, if one calibration sensor is intended to be responsible for the calibration of all the laser diodes, a mechanism for moving this calibration sensor is required, leading to the increase in system cost of the CTP system. The provision of calibration sensors in a corresponding relationship with all the laser diodes also naturally results in the increase in system cost.

After all, the larger number of laser diodes results in a longer period of time required for calibration. From a point of view of enhancing the operating rate of a system, calibration itself is desirably as simple as possible.

SUMMARY OF THE INVENTION

The present invention relates to a technique of controlling the amount of laser light used for exposure, and more specifically, to a technique of controlling the amount of light at a laser diode (LD) used in an exposure head (light source) of a CTP (computer-to-plate) system.

According to the present invention, an exposure device for making exposure of a subject to be exposed by laser light comprises: a main controller responsible for overall control of the operation of the exposure device; a laser emitter for emitting laser light; and a laser controller for controlling the emission of laser light from the laser emitter on receipt of an instruction for control given from the main controller. The laser controller is configured as a circuit board capable of independently being changed, and has a memory into which error control information for controlling variations of a controlling factor due to a circuit error of the circuit board is stored prior to the provision of the circuit board to the exposure device. On receipt of an instruction for control given from the main controller to cause the emission of laser light in a predetermined amount of light, the laser controller determines a condition of emission of laser light based on the error control information stored in the memory to cause the laser emitter to emit laser light under the condition.

Thus, even when a circuit board operative to function as the laser controller in the exposure device is changed to another, emission of laser light in a predetermined amount of light required for exposure is realized at the laser emitter without calibration using a calibration sensor.

Preferably, the laser controller applies a control current responsive to the amount of light emission requested by the main controller to the laser emitter to control the emission of the laser light at the laser controller, and the error control information is used to control the control current based on the circuit error.

According to another aspect of the present invention, the laser emitter includes an photoelectric converter for detecting laser light emitted at the laser emitter, and outputting a monitor current of a current value responsive to the amount of the detected laser light. The laser controller performs feedback control for controlling light emission at the laser emitter based on the current value of the monitor current given from the photoelectric converter. The error control information is used to control reference information in the feedback control based on the circuit error.

It is therefore an object of the present invention to provide an exposure device capable of controlling the amount of laser light used for exposure at a predetermined level without a calibration sensor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing the main operating part of a CTP system 100;

DESCRIPTION OF THE PREFERRED EMBODIMENTS

<System Overview>

Figure 2:
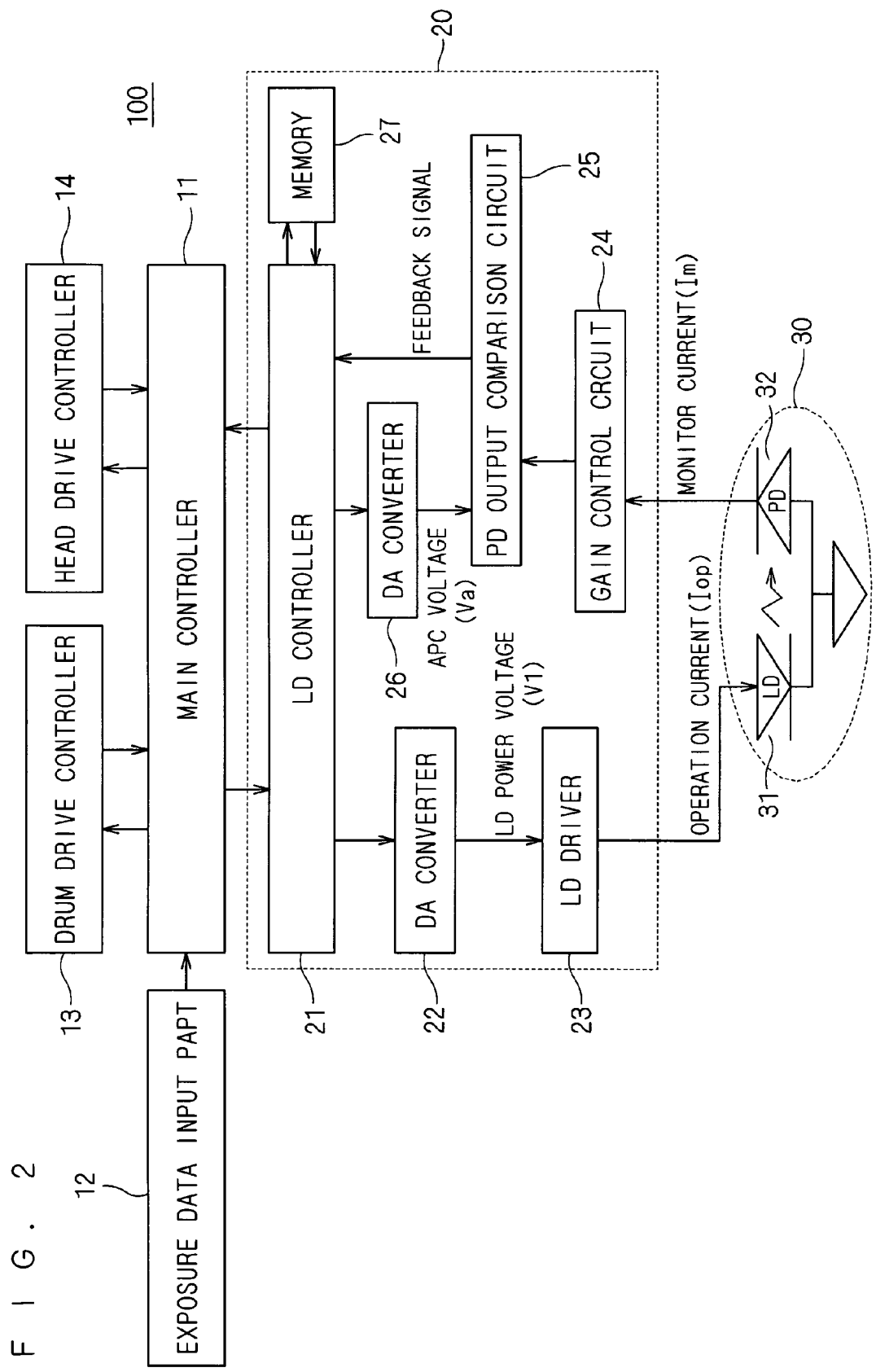
FIG. 2 is a block diagram schematically showing elements for controlling the operation of the CTP system 100.

FIG. 1 is a perspective view showing the main operating part of a CTP system 100 according to a preferred embodiment of the present invention. In the CTP system 100, laser beams are applied from laser light sources in an exposure head 5 to a surface of a printing plate P as a member to be exposed arranged on the side surface of a drum 1 while on-off control is performed in pixels based on certain exposure data, thereby causing a photosensitive material on the surface of the printing plate P to be exposed to light to form an exposure image. That is, the CTP system 100 is a system with a function as an exposure device.

The drum 1 is a cylindrical member that is driven by a drum drive member 6 (such as a drive motor) to rotate about an axis of rotation AX.

The exposure head 5 has a number of LD units 30 that are spaced apart at intervals of w in a direction parallel to the axis of rotation AX. Each one of the LD units 30 has a laser diode (LD) 31 as a laser light source. In the CTP system 100 according to the present preferred embodiment, no calibration sensor is provided between the laser diode 31 and the drum 1 (or the printing plate P arranged on the cylindrical surface of the drum 1). That is, light emitted from the laser diode 31 is directly applied to the printing plate P. The exposure head 5 is guided along a guide not shown by the operations of a head carrier ball screw 3 and a head carrier motor 4.

FIG. 2 is a block diagram schematically showing elements for controlling the operation of the CTP system 100. The CTP system 100 further comprises: a main controller 11 that is formed for example by a CPU, a ROM, and a RAM not shown, and is responsible for the control of the overall operation of the CTP system 100; an exposure data input part 12 for obtaining exposure data that describes on-off information of laser light for exposure (corresponding to digitized information of an exposure image) in pixels; a drum drive controller 13 for controlling the rotation of the drum 1 caused by the drum drive member 6; a head drive controller 14 for controlling the operations of the head carrier ball screw 3 and the head carrier motor 4; and an LD controller 21 for controlling the on-off operation of laser light beams emitted from the laser diodes 31.

As for the exposure data input part 12, a media reader not shown capable of reading the contents stored in a portable storage medium, or a communication interface capable of accessing an external device connected to the CTP system 100 via a communication network such as a LAN is applicable. If the media reader is employed, exposure data stored in a storage medium is retrieved by the exposure data input part 12. If the communication interface is employed, exposure data stored in an external storage device such as a hard disk or a database server is retrieved by the exposure data input part 12.

In the CTP system 100, the main controller 11 gives a control signal to each controller according to the description of exposure data retrieved by the exposure data input part 12. Then, each controller controls the operation of a corresponding element to be controlled based on this control signal to thereby realize the formation of an exposure image onto the printing plate P.

More specifically, while the drum 1 is rotated at a certain speed of rotation by the drum drive member 6 under control of the drum drive controller 13, laser light is emitted from each of the laser diodes 31 under control of the LD controller 21 and the exposure head 5 is moved in a direction parallel to the axis of rotation AX under head control of the head drive controller 14. This causes the laser diodes 31 to simultaneously form certain portions of a desired exposure image. This exposure continues while the exposure head 5 is moved a distance corresponding to the interval w to thereby form an exposure image as an aggregate of partial exposure images that are consecutively arranged.

<Principles of Controlling Emission of Laser Light>

Next, the basic principles of controlling the emission of laser light in the CTP system 100 are described. As for constituent elements responsible for this emission control of laser light, the CTP system 100 mainly includes a DA converter (DAC) 22, an LD driver 23, a gain control circuit 24, a PD output comparison circuit 25, a DA converter 26, and a memory 27. These constituent elements and the LD controller 21 are formed on an LD control board 20. In the CTP system 100, the LD control board 20 is exchangeable. Each of the LD units 30 has a photodiode (PD) 32 in addition to the laser diode 31.

As discussed above, in the CTP system 100, a number of LD units 30 are arranged, and each of the LD units 30 has the laser diode 31 at which emission of laser light is generated. The way of emission control is the same between all the laser diodes 31, so the description given below is applicable to all the laser diodes 31.

In the present preferred embodiment, it is assumed that the LD controller 21 and the other constituent elements on a single LD control board 20 are responsible for the control of the light emission at all the laser diodes 31. However, the substance of control is the same when a plurality of LD control boards 20 are provided and emissions from the respective laser diodes 31 are controlled by different LD controllers 21 (such as the case in which the LD control boards 20 are provided in a corresponding relationship with the laser diodes 31).

<First Basic Control Mode>

In the CTP system 100, in response to a predetermined control signal given from the main controller 11, the LD controller 21 applies an LD power voltage V1 of a predetermined level through the DA converter 22 to the LD driver 23, thereby causing the flow of an operation current $I_{OP}$ of a value according to this voltage level from the LD driver 23 to each laser diode 31. Then, each laser diode 31 emits (applies) laser light in an amount of light that is responsive to this value of the operation current $I_{OP}$.

Generally, the amount of light required for the formation of an exposure image is constant with respect to all the laser diodes 31. The level of the LD power voltage V1 to be applied to cause the flow of the operation current $I_{OP}$ of a value according to this constant level is specified in advance with regard to each one of the laser diodes 31. Then, the LD power voltage V1 of this level is applied in response to the on-off state of an exposure image, thereby causing each of the laser diodes 31 to emit light in the same amount. Thus, an exposure image as a whole is formed with a constant amount of light for exposure. This mode of controlling the emission of laser light is referred to as a "first basic control mode".

In order to realize the formation of an exposure image based on the first basic control mode, information indicative of a relationship between the amount of laser light used for exposure and the operation current $I_{OP}$ for realizing emission in this amount of laser light is required. This relationship is unique to each LD unit 30 (more specifically, unique to each laser diode 31). In the present preferred embodiment, the relationship between the operation current $I_{OP}$ and the amount of light is predefined prior to the provision of the LD units 30 to the exposure head 5 (at the time of manufacture of the LD units 30, for example). Then, this relationship is stored into the main controller 11 at the time of provision of the LD units 30.

As discussed, in the first basic control mode, a control signal is given from the main controller 11 to the LD controller 21 so that the operation current $I_{OP}$ of a value stored in the main controller 11 is caused to flow into each of the laser diodes 31. Then, the LD controller 21 applies the LD power voltage V1 responsive to this operation current $I_{OP}$ to the LD driver 23 to thereby realize exposure with a predetermined amount of light.

<Second Basic Control Mode>

Feedback control may be introduced in place of the first basic control mode. In this feedback control, light emission at each of the laser diodes 31 is detected by each of the photodiodes (PD) 32 as one of photoelectric converters. Based on the detected amount of light emission, the level of the LD power voltage V1 to be applied to the LD driver 23 is controlled to thereby cause the emission of laser light in a constant amount of light from the laser diodes 31.

More specifically, while the LD power voltage V1 of a predetermined level is applied to cause the emission at each laser diode 31, a monitor current $I_m$ flowing from each photodiode 32 in response to the amount of light emission is given to the gain control circuit 24 to be converted to a voltage level (voltage Vs to be tested). At the PD output comparison circuit 25, the voltage Vs is compared with an APC voltage Va as a reference voltage applied from the LD controller 21 through the DA converter 26. A feedback signal responsive to the result of the comparison is fed back to the LD controller 21 to thereby control the application of the LD power voltage V1 from the LD controller 21. Namely, the voltage Vs equals the APC voltage Va when the flowing monitor current $I_m$ is proportionate to the light amount required for the formation of an exposure image. This mode of controlling the emission of laser light is referred to as a "second basic control mode".

In order to realize the formation of an exposure image based on the second basic control mode, information indicative of a relationship between the amount of laser light used for exposure and the monitor current $I_m$ that flows in response to this amount should be specified in advance. Here, the monitor current $I_m$ has such a value that it allows the voltage Vs to be proportionate to the APC voltage Va. This relationship is unique to each LD unit 30 (more specifically, a set of the laser diode 31 and the photodiode 32). Like the operation current $I_{OP}$ in the first basic control mode, this relationship is predefined prior to the provision of the LD units 30 to the exposure head 5, and is stored into the main controller 11 at the time of provision of the LD units 30.

In the second basic control mode, the main controller 11 knows the APC voltage Va proportionate to the certain amount of light emission (or the monitor current $I_m$) in advance. Then, based on a difference between the voltage Vs according to the actually flowing monitor current $I_m$ and the APC voltage Va, the LD controller 21 performs feedback control for controlling the application of the LD power voltage V1 to the LD driver 23 to thereby realize exposure with a predetermined amount of light.

<Actual Light Emission Control>

As discussed above, in the CTP system 100, the main controller 11 stores information required to realize emission of laser light in a predetermined amount of light necessary for exposure. This information specifies a relationship between the operation current $I_{OP}$ and this predetermined amount of light, or a relationship between the amount of light emission (or the monitor current $I_m$) and the APC voltage Va. Thus, if the LD power voltage V1 of a constant level is ideally applied to the LD driver 23 based on these relationships, light emission in a predetermined amount of light is to be constantly realized either in the first basic control mode or in the second basic control mode.

However, the LD control board 20 generally has individual differences (circuit errors) caused by errors in the design stage and the like. Hence, when the LD control board 20 is changed to another, the LD power voltage V1 required to realize emission in the same amount of laser light may be at different levels between before and after the change. As an example, in the first basic control mode, if the LD power voltage V1 to be applied in one LD control board 20 to cause the flow of the operation current $I_{OP}$ of a certain value is also applied in another LD control board 20, the operation current $I_{OP}$ does not necessarily have the same value as that obtained in the previous LD control board 20. This may force the amount of laser light to deviate from a desired value.

In a conventional technique, a calibration sensor is used to perform the calibration of the amount of laser light each time the LD control board 20 is changed to thereby correct such deviation of light amount. According to this calibration, the LD power voltage V1 is so controlled that light amount is kept at a predetermined level.

As seen from the first and second basic control modes discussed above, what is influenced by the individual differences of the LD control boards 20 is a relationship between the LD power voltage V1 applied from the LD controller 21 to the LD driver 23 and the operation current $I_{OP}$ output from the LD driver 23 in the first basic control mode. In the second basic control mode, the individual differences of the LD control boards 20 exert an influence upon a relationship between the monitor current $I_m$ output from the photodiode 32 and the APC voltage Va applied from the LD controller 21. (Here, the level of the feedback signal controls the LD power voltage V1, meaning that a relationship between the monitor current $I_m$ and the LD power voltage V1 is eventually influenced). In contrast, relationships between the operation current $I_{OP}$ and the amount of laser light, and between the monitor current $I_m$ and the amount of laser light are unique to each laser diode 31. Thus, as long as the operation current $I_{OP}$ or the monitor current $I_m$ keeps the same value, the same amount of laser light is obtained even with the presence of the individual differences of the LD control boards 20.

Accordingly, the control in the first basic control mode is such that the operation current $I_{OP}$ of the same value is output even on different LD control boards 20. In the second basic control mode, the APC voltage Va is controlled so that the level of the feedback signal is zero with the monitor current $I_m$ of the same value even on different LD control boards 20. These controls eliminate the calibration involved in the change of the LD control board 20.

With this point kept in mind, in the present preferred embodiment, information for specifying a relationship between the LD power voltage V1 and the operation current $I_{OP}$, and information for specifying a relationship between the monitor current $I_m$ and the APC voltage Va that are established on the LD control board 20, are stored in advance into the memory 27 provided to this LD control board 20. These pieces of information are referred to as error control information. In the CTP system 100, the LD controller 21 performs control with reference to the error control information stored in the memory 27. Thus, even when the LD control board 20 is changed to another, emission of laser light in an amount of light required for exposure is realized without calibration using a calibration sensor.

Hereinafter, effective control modes corresponding to the first and second basic control modes that are realized with reference to the error control information stored in advance in the LD control board 20 are particularly referred to as a "first effective control mode" and a "second effective control mode", respectively. These modes of control are discussed one by one below.

<First Effective Control Mode>

In the first effective control mode, when the main controller 11 requests the emission of laser light by generating the flow of the operation current $I_{OP}$ of a certain current value, the LD power voltage V1 that realizes this current value should be properly applied to the LD driver 23. That is, a relationship between the LD power voltage V1 applied from the LD controller 21 to the LD driver 23 and the operation current $I_{OP}$ output from the LD driver 23 should be uniquely specified. In the LD driver 23, a proportional relationship represented by the following formula (1) is established between the LD power voltage V1 to be applied thereto and the operation current $I_{OP}$. Thus, information capable of uniquely defining the factor α (α>0) in formula (1) is stored as first error control information into the memory 27 prior to the provision of the LD control board 20 to the CTP system 100 (at the time of shipment, for example).

$$I_{OP} = \alpha \cdot V1 \quad \text{formula (1)}$$

Figure 3:
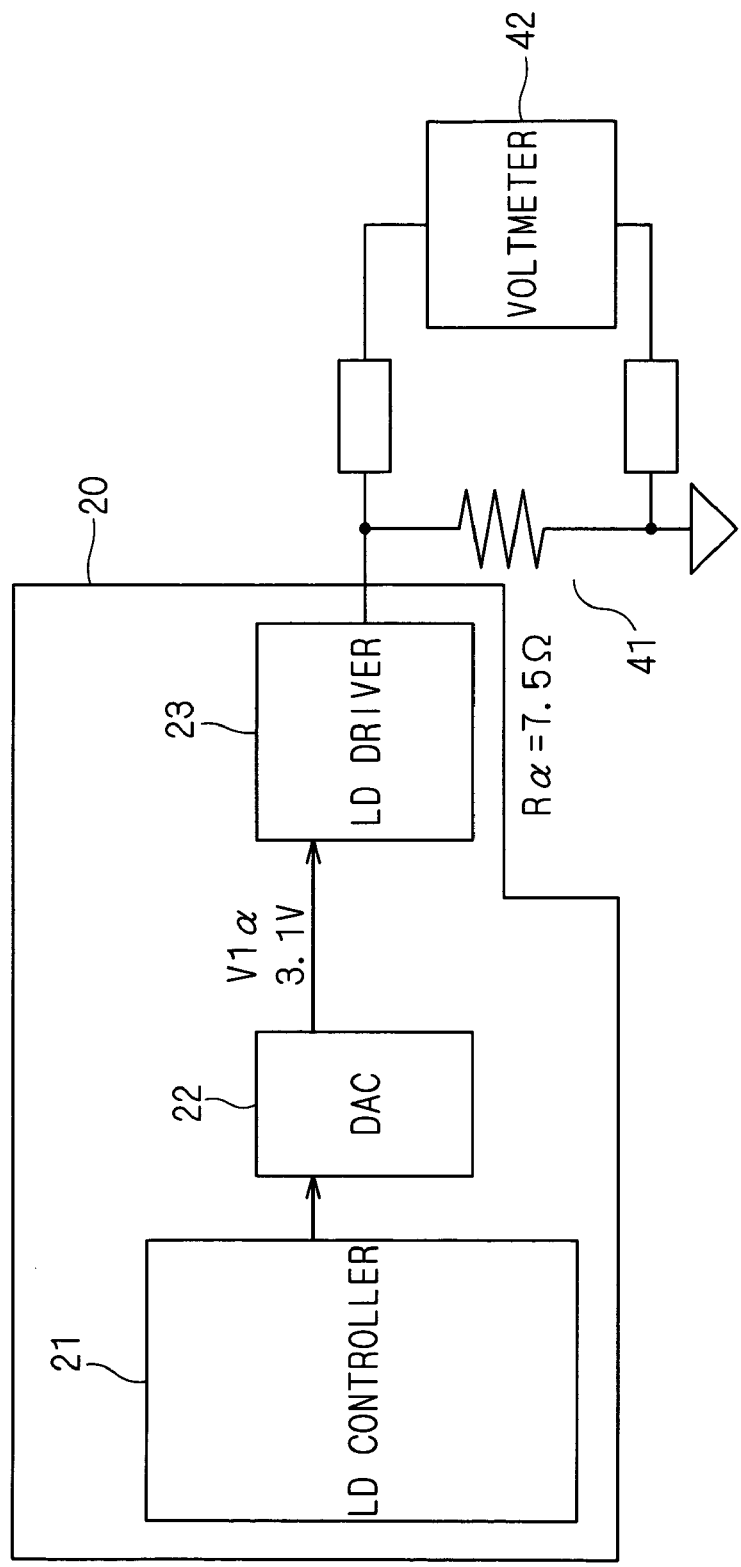
FIG. 3 shows how to obtain first error control information with regard to an LD control board 20.

FIG. 3 shows how to obtain the first error control information with regard to the LD control board 20 before being mounted onto the CTP system 100. First, a resistor 41 of a given resistance $R_\alpha$ (in FIG. 3, 7.5Ω) is connected to the LD driver 23 on the LD control board 20. Then, a given voltage $V1_\alpha$ (in FIG. 3, 3.1 V) is applied from the LD controller 21 to the LD driver 23 through the DA converter 22. In this condition, a potential difference ΔV across the resistor 41 is measured by a voltmeter 42. Then, a current value $I_\alpha$ of a current flowing through the resistor 41 at this time is obtained by the following formula (2).

$$I_\alpha = \Delta V / R_\alpha \quad \text{formula (2)}$$

The current value $I_\alpha$ corresponds to the value of the operation current $I_{OP}$ that is given by applying the LD power voltage V1 of a voltage level $V1_\alpha$ to the LD driver 23. This voltage level $V1_\alpha$ is referred to as a first reference voltage level, and the current value $I_\alpha$ is referred to as a first reference current value. Based on the formula (1), a relationship expressed by the following formula (3) is established between the first reference voltage level and the first reference current value.

$$I_\alpha = \alpha \cdot V1_\alpha \quad \text{formula (3)}$$

As the factor α is uniquely specified by modifying the formula (3), the first reference voltage level $V1_\alpha$ and the first reference current value $I_\alpha$ are stored as the first error control information into the memory 27. By using these values, the level of the LD power voltage V1 required to output the operation current $I_{OP}$ of a desired value is determined. In this regard, the first error control information may also be referred to as information for specifying a proportional relationship between the LD power voltage V1 and the operation current $I_{OP}$. The level of the LD power voltage V1 is practically determined from the following formula (4) without calculating the factor α itself.

$$V1 = (I_{OP}/I) \cdot V1_\alpha \quad \text{formula (4)}$$

In the example shown in FIG. 3 where the current value $I_\alpha$ is 280 mA, assuming that the operation current $I_{OP}$ of 140 mA is required to flow, the following expression is established based on the formula (4).

$$V1 = (140/280) \times 3.1 = 1.55 \text{ V}$$

When the amount of light emission used for exposure is determined in several stages according to the details of exposure, the first error control information responsive to each stage is specified and is then stored into the memory 27.

That is, in the first effective control mode, the main controller 11 causes the LD controller 21 to retrieve the first reference voltage level and the first reference current value stored in advance into the memory 27, to cause the application of the LD power voltage V1 obtained from the formula (4). Thus, even if the LD control board 20 is changed to another, the first reference voltage level and the first reference current value stored in the memory 27 of the new LD control board 20 are retrieved to perform the calculation based on the formula (4). As a result, the level of the LD power voltage V1 that should be set in this LD control board 20 is determined. That is, by the flow of the operation current $I_{OP}$ of an appropriate value, the emission of laser light in a predetermined amount of light required for exposure is realized without calibration using a calibration sensor.

<Second Effective Control Mode>

In the second effective control mode, the emission of laser light of a desired amount of light is required under the condition in which the voltage Vs obtained by converting the monitor current $I_m$ flowing from each photodiode 32 at the gain control circuit 24 equals the APC voltage Va applied from the LD controller 21 through the DA converter 26 (the condition in which the level of the feedback signal is zero). That is, feedback control should be performed in such a way as to prevent the feedback signal from being at zero under the condition that the amount of light emission is too much or too little.

First, in the gain control circuit 24, the voltage Vs is obtained based on a relationship represented by the following formula (5). In the formula (5), $K_0$ ($K_0$>0) represents a factor that gives an actual gain in the gain control circuit 24, and β (β>0) represents a factor indicative of a circuit error (circuit error factor).

$$Vs = \beta \cdot K_0 \cdot I_m \quad \text{formula (5)}$$

The factor K0 has a value that has been given from the stage of circuit design, and is stored in advance in the main controller 11. The circuit error factor β depends on the LD control board 20. Hence, the level of the voltage Vs varies with different circuit error factors β even if the monitor current $I_m$ of the same value flows.

With the monitor current $I_m$ given a value $I_{ma}$, the following formula (6) is established based on the formula (5) when the voltage Vs equals the APC voltage Va.

$$Va = \beta \cdot K_0 \cdot I_{ma} \quad \text{formula (6)}$$

If there is no circuit error in the gain control circuit 24, the factor β is one. With the monitor current $I_m$ of the value $I_{ma}$ and with the voltage Vs of a level $Vs_i$ that is obtained in the absence of a circuit error, a relationship expressed by the following formula (7) is established based on the formula (5).

$$Vs_i = \beta \cdot K_0 \cdot I_{ma} \quad \text{formula (7)}$$

Then, based on the formulas (6) and (7), a relationship expressed by the following formula (8) is established.

$$Va = \beta \cdot Vs_i \quad \text{formula (8)}$$

The formula (8) indicates that the APC voltage Va equivalent to the voltage Vs is obtained by multiplying the level $Vs_i$ of the voltage Vs by the circuit error factor β.

The level $Vs_i$ is obtained from the formula (7) as long as the value $I_{ma}$ of the monitor current $I_m$ is known. Then, information capable of uniquely defining the circuit error factor β is stored as second error control information into the memory 27 of the LD control board 20 before being mounted onto the CTP system 100 (at the time of shipment, for example). In other words, the second error control information specifies the ratio of an actual level of the APC voltage Va to an ideal level of the APC voltage Va that is obtained in the absence of a circuit error.

Figure 4:
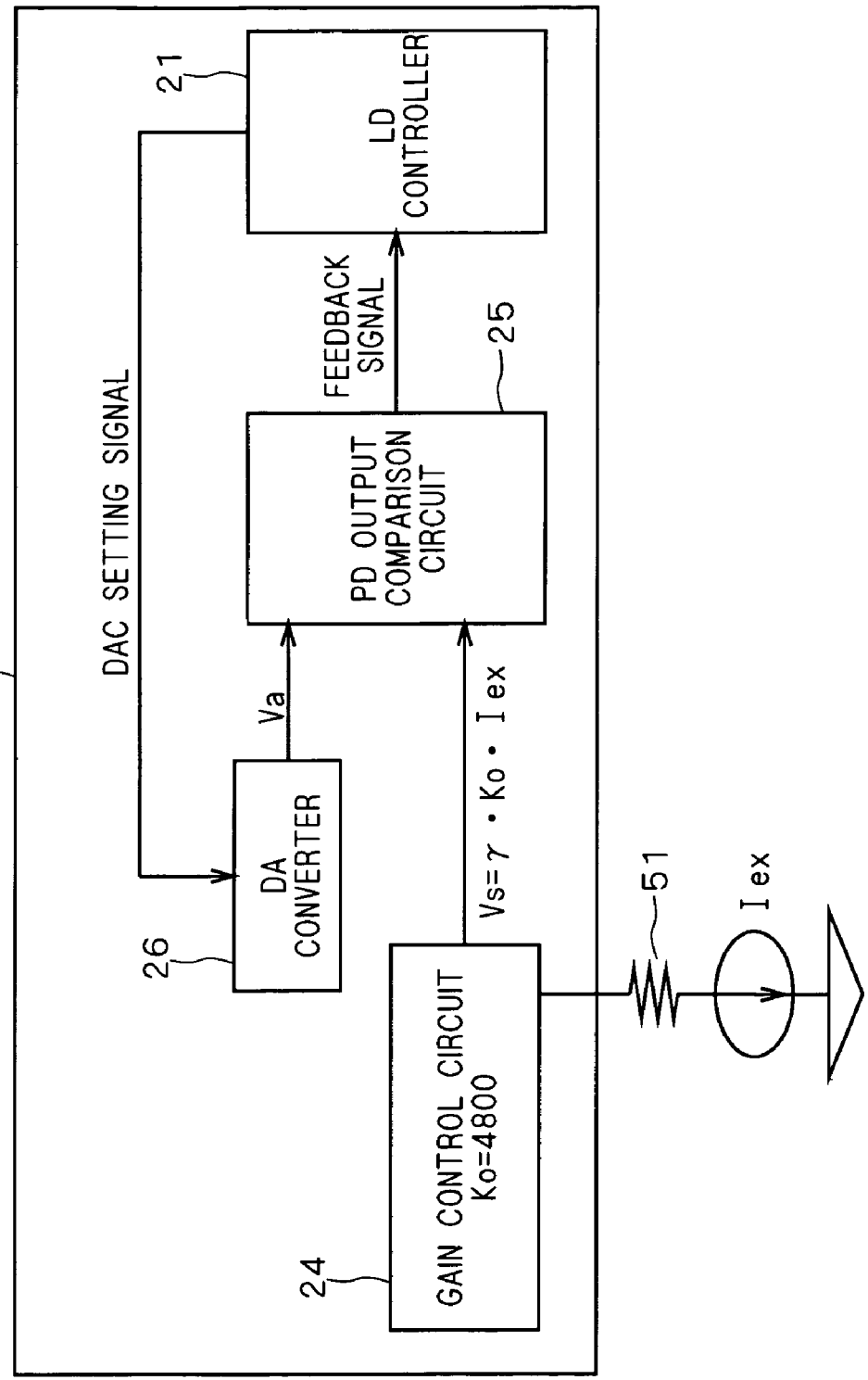
FIG. 4 shows how to obtain second error control information with regard to the LD control board 20.

FIG. 4 shows how to obtain the second error control information with regard to the LD control board 20 before being mounted onto the CTP system 100.

First, a resistor 51 of a given resistance is connected to the gain control circuit 24 on the control board 20. Then, a constant current of a given value (in FIG. 4, a current value $I_{ex}$) is caused to flow through the gain control circuit 24, thereby applying the voltage Vs of a voltage level $V_{ex}$ from the gain control circuit 24 to the PD output comparison circuit 25. At this time, the voltage level $V_{ex}$ is not known.

At the same time, while monitoring the feedback signal given from the PD output comparison circuit 25, the LD controller 21 gives a DAC setting signal to the DA converter 26 to thereby perform feedback control for gradually increasing the voltage level of the APC voltage Va. This feedback control continues to reach a point at which the feedback signal is zero, and the voltage level of the APC voltage Va and the level of the voltage Vs (voltage level $V_{ex}$) are the same. The APC voltage Vs applied at this time from the DA converter 26 has the voltage level $V_{ex}$. The current value $I_{ex}$ of the constant current flowing at this time is referred to as a second reference current value, and the voltage level $V_{ex}$ of the APC voltage Va is referred to as a second reference voltage level. Based on the formula (5), a relationship expressed by the following formula (9) is established between the second reference current value and the second reference voltage level.

$$V_{ex} = \beta \cdot K_0 \cdot I_{ex}$$ formula (9)

As the circuit error factor β is uniquely specified by modifying the formula (9), the second reference voltage level $V_{ex}$ and the second reference current value $I_{ex}$ are stored as the second error control information into the memory 27. By using these values, a desired level of the APC voltage Va required to realize the emission of laser light in a certain amount (with the monitor current $I_m$ of a certain value) is determined. The level of the APC voltage Va is practically determined from the following formula (10) without calculating the circuit error factor β itself.

$$Va = (V_{ex} \cdot Vs_i)/(K_0 \cdot I_{ex})$$ formula (10)

As an example, when the gain control circuit 24 is designed so that the factor $K_0$ is 4800, the ideal level $Vs_i$ of the voltage Vs is 2V, and the second error control information specifying $I_{ex}$ as 0.5 mA and $V_{ex}$ as 1.8 V is stored in the memory 27 on one LD control board 20, the APC voltage Va of this LD control board 20 is calculated as $$Va = (1.8 \times 2)/(4800 \times 0.5 \times 10^{-3}) = 1.5\ V$$

In another case where the second error control information specifying $I_{ex}$ as 0.48 mA and $V_{ex}$ as 1.7 V is stored in the memory 27 on one LD control board 20, the APC voltage Va of this LD control board 20 is calculated as $$Va = (1.7 \times 2)/(4800 \times 0.48 \times 10^{-3}) = 1.476\ V$$

When the amount of light emission for exposure is determined in several stages according to the details of exposure, the second error control information responsive to each stage is specified and is then stored into the memory 27.

That is, in the second effective control mode, the main controller 11 causes the LD controller 21 to retrieve the second reference voltage level and the second reference current value stored in advance into the memory 28, to cause the application of the APC voltage Va obtained from the formula (10) to the PD output comparison circuit 25. Thus, even when the LD control board 20 is changed to another, the second reference voltage level and the second reference current value stored in the memory 27 of this new LD control board 20 are retrieved to perform the calculation based on the formula (10). As a result, the level of the APC voltage Va that should be set in this LD control board 20 is determined. This means that the feedback control for making the feedback signal to be zero is realized without calibration using a calibration sensor when the emission of laser light in a desired amount of light is generated. That is, the emission of laser light in a predetermined amount of light required for exposure is realized.

<Modifications>

The applicability of the correction of an error due to individual differences of LD control boards in the above-described preferred embodiment is not limited to a CTP system such as the CTP system 100 in which laser diodes are spaced apart. This correction is also applicable to a generally used exposure system that realizes emission control of a laser diode by using a control circuit similar to the LD control board 20.

In the above-described preferred embodiment, the printing plate P on the surface of the drum 1 is a target for exposure. The surface itself of the drum 1 may be a target for exposure instead. In this case, an electrostatic latent image formed on this surface of the drum 1 is transferred to a certain destination of transfer to thereby form an image.

The transportation of the printing plate P into and out of the CTP system 100, and the attachment and removal of the printing plate P to and from the drum 1 may be realized by a predetermined device not shown. In this case, a controller responsible for the control of these processes is also prepared.

While the invention has been shown and described in detail, the foregoing description is in all aspects illustrative and not restrictive. It is therefore understood that numerous modifications and variations can be devised without departing from the scope of the invention.

What is claimed is:

1. An exposure device for making exposure of a subject to be exposed by laser light, comprising:
   a main controller responsible for overall control of the operation of said exposure device;
   a laser emitter for emitting laser light; and
   a laser controller for controlling the emission of laser light from said laser emitter on receipt of an instruction for control given from said main controller, said laser controller being configured as a circuit board capable of independently being changed, said laser controller having a memory into which error control information for controlling variations of a controlling factor due to a circuit error of said circuit board is stored prior to the provision of said circuit board to said exposure device,
   on receipt of an instruction for control given from said main controller to cause the emission of laser light in a predetermined amount of light, said laser controller determining a condition of emission of laser light based on said error control information stored in said memory to cause said laser emitter to emit laser light under said condition, wherein
   said laser emitter includes a photoelectric converter for detecting laser light emitted at said laser emitter, and outputting a monitor current of a current value responsive to an amount of the detected laser light, said laser controller performs feedback control for controlling light emission at said laser emitter based on said current value of said monitor current output by said photoelectric converter, wherein said laser controller includes:
- a control circuit for converting said current value of said monitor current to a voltage level, and outputting the voltage level;
- a reference voltage output element for outputting a reference voltage to be employed as a criterion for said feedback control; and
- a comparison circuit for making comparison between a voltage level output from said control circuit and said reference voltage to output a feedback signal based on a result of said comparison, and said error control information is used to control reference voltage in said feedback control based on said circuit error.

2. The exposure device according to claim 1, wherein said error control information is used to specify a ratio of an actual level of said reference voltage to an ideal level of said reference voltage that is obtained in the absence of said circuit error.

3. A circuit board for a laser controller, comprising:
a laser light control element operative to function as a laser controller, in a condition in which said circuit board is mounted onto a laser light emitting device for emitting laser light, said laser controller controlling the emission of laser light from a laser emitter in said laser light emitting device on receipt of an instruction for control given from a main controller responsible for overall control of the operation of said laser light emitting device; and
a memory into which error control information for controlling variations of a controlling factor due to a circuit error of said circuit board is stored in said laser light emitting device when said circuit board is operative to function as said laser controller, in said laser light emitting device with said circuit board mounted thereon, on receipt of an instruction for control given from said main controller to cause the emission of laser light in a predetermined amount of light, said laser controller determining a condition of emission of laser light based on said error control information stored in said memory to cause said laser emitter to emit laser light under said condition, wherein said laser emitter includes a photoelectric converter for detecting laser light emitted at said laser emitter, and outputting a monitor current of a current value responsive to an amount of the detected laser light, said laser controller performs feedback control for controlling light emission at said laser emitter based on said current value of said monitor current output by said photoelectric converter, wherein said laser controller includes:
- a control circuit for converting said current value of said monitor current to a voltage level, and outputting the voltage level;
- a reference voltage output element for outputting a reference voltage to be employed as a criterion for said feedback control; and
- a comparison circuit for making comparison between a voltage level output from said control circuit and said reference voltage to output a feedback signal based on a result of said comparison, and said error control information is used to control reference voltage in said feedback control based on said circuit error.

* * * * *